United States Patent [19]

Crosby

[11] 4,309,692
[45] Jan. 5, 1982

[54] INTEGRATING ANALOG-TO-DIGITAL CONVERTER

[75] Inventor: John B. Crosby, Yorba Linda, Calif.

[73] Assignee: Beckman Instruments, Inc., Fullerton, Calif.

[21] Appl. No.: 960,696

[22] Filed: Nov. 14, 1978

[51] Int. Cl.³ .............................................. H03K 13/02
[52] U.S. Cl. ........................ 340/347 NT; 324/99 D; 340/347 M; 340/347 AD
[58] Field of Search .... 340/347 M, 347 AD, 347 NT; 324/99 D, 111, 78 D, 78 E, 76 A

[56] References Cited

U.S. PATENT DOCUMENTS

| | | | |
|---|---|---|---|
| 3,480,948 | 11/1969 | Lord | 340/347 NT |
| 3,878,534 | 4/1975 | Horwitz et al. | 340/347 NT |
| 3,893,105 | 7/1975 | Wasserman | 340/347 NT |
| 3,895,376 | 7/1975 | Uchida | 340/347 M X |
| 3,900,844 | 8/1975 | Wald | 340/347 C |
| 3,906,486 | 9/1975 | Phillips | 340/347 NT |
| 3,930,252 | 12/1975 | Storar | 340/347 NT |
| 4,057,796 | 11/1977 | Hoogendoorn et al. | 340/347 AD |
| 4,074,257 | 2/1978 | Henry | 340/347 NT |
| 4,082,998 | 4/1978 | Marriott | 340/347 NT X |
| 4,089,012 | 5/1978 | Kawasaki | 354/60 L X |
| 4,112,428 | 9/1978 | Dorsman | 340/347 NT |
| 4,163,947 | 8/1979 | Weedon | 328/128 |

FOREIGN PATENT DOCUMENTS 1417236 12/1975 United Kingdom .

*Primary Examiner*—Thomas J. Sloyan
*Attorney, Agent, or Firm*—R. J. Steinmeyer; Ferd L. Mehlhoff

[57] ABSTRACT

An integrating analog-to-digital converter for producing a digital output signal representing the value of an analog input signal which may have either a positive or negative polarity. The converter uses a switching circuit to reverse an integrator capacitor between charge and discharge periods so that the same input-signal-controlled current source can be used to both charge and discharge the capacitor. This results in inherent zero calibration because any offset errors during the charge cycle are cancelled out by equal and opposite offsets during the discharge cycle.

32 Claims, 5 Drawing Figures

4,309,692

INTEGRATING ANALOG-TO-DIGITAL CONVERTER

BACKGROUND OF THE INVENTION

The present invention relates to analog-to-digital converters of the type which alternately charge and discharge an energy storing means for converting an analog input signal into a digital signal. The charging and discharging of the energy storing means is done at different rates, at least one of such rates being dependent upon the amplitude of the analog input signal. By comparing the respective times of the charge and discharge cycles, a signal proportional to the amplitude of the input signal can be derived. This signal is converted into a digital signal by counting clock pulses during the charging and/or discharging cycles.

It is important to calibrate such A/D converters to preclude any offset error between the value of the analog input signal and the value represented by the digital output signal; i.e., to ensure that if the value of the input signal equals zero, then the value represented by the digital output signal also equals zero. In all prior art converters known to this inverter, this zero calibration requires precisely matched or adjusted component values. However, these component values are inherently subject to drift, thereby rendering unstable the zero calibration.

Some prior art converters include additional circuitry to automatically stabilize the zero calibration, generally by measuring the amount of drift in the critical component values and compensating therefor. The operation of these converters generally requires a periodic auto-zeroing cycle during which the drift is measured and compensated for.

SUMMARY OF THE INVENTION

The invention is an integrating analog-to-digital converter comprising one or more of the following features.

One feature is a switching circuit which connects an integrator capacitor to a charge/discharge circuit or controlled current source with one orientation during a first fixed-duration period, and with the opposite orientation during a second variable-duration period.

An advantage resulting from this feature is that the offset error in capacitor current during the first fixed-duration period caused by offset voltages in any part of the charge/discharge circuit or controlled current source is exactly balanced by an equal and opposite capacitor current offset during the second variable-duration period.

Another feature is a switching circuit, which need not be distinct from the previous switching circuit, which effectively disconnects at least one terminal of the capacitor from the charge/discharge circuit or controlled current source during the time interval from the end of the second variable-duration period of each conversion cycle to the beginning of the first fixed-duration period of the next conversion cycle.

An advantage resulting from this feature is that it inherently precludes any errors potentially caused by the offset voltage of the comparator and the initial capacitor charge by ensuring that the initial capacitor charge at the beginning of the first time period of a conversion cycle equals the charge sensed by the comparator at the end of the second time period. A further advantage is that it reduces errors potentially caused by the comparator's having a relatively slow speed or long propagation time, because the change in capacitor voltage from the time it crosses the comparator threshold to the time the comparator output responds to this event is like an additional comparator offset voltage.

Another feature is a particular charge/discharge circuit, alternatively termed a voltage-controlled current source, whose use in an analog-to-digital converter is novel. This charge/discharge circuit comprises a transistor which controls a current flow, and an operational amplifier whose output controls the transistor and whose two differential inputs respectively connect to the analog input signal and to a resistor through which flows the current controlled by the transistor.

One advantage resulting from this feature is that it enables the analog-to-digital converter to be built with one less operational amplifier than is used in most prior art converters. The omitted amplifier is the one often used in the prior art as part of an integrator wherein an integrator capacitor is connected in a negative feedback path between the output and inverting input of the amplifier. The featured charge/discharge circuit may be connected directly to an integrator capacitor without this extra amplifier because, unlike prior art circuits, the current it supplies to the capacitor is essentially independent of the capacitor voltage.

DESCRIPTION OF THE PREFERRED EMBODIMENT

Figure 1:
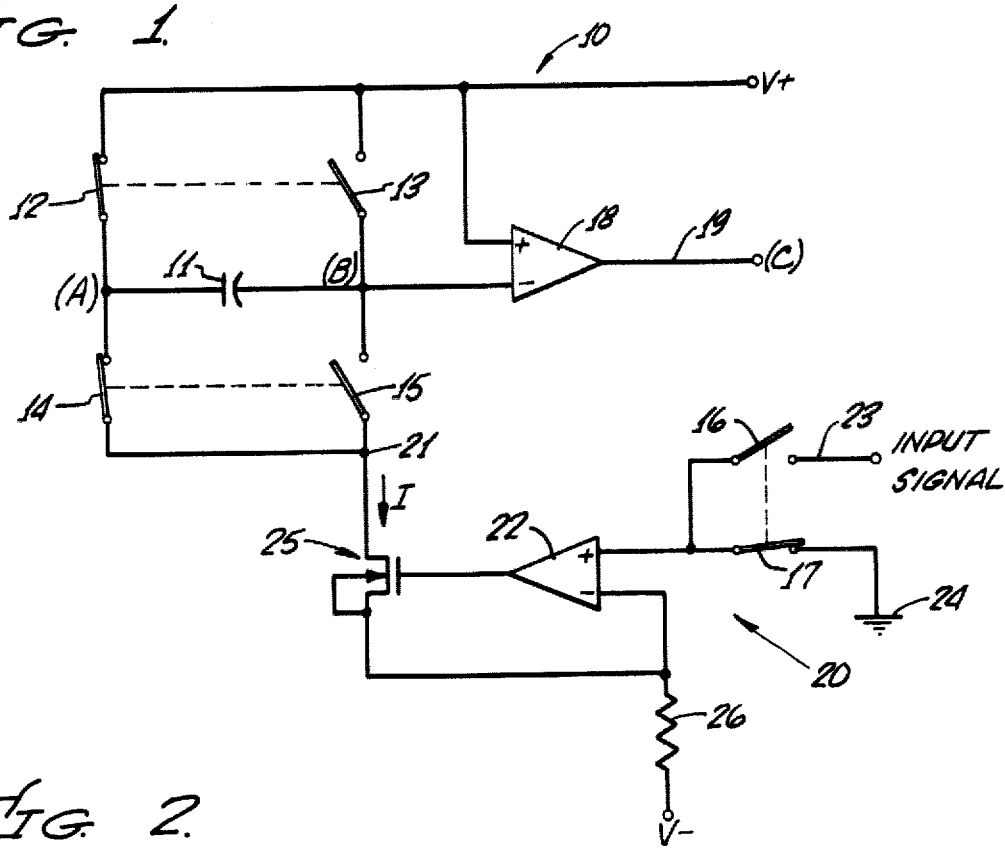
FIG. 1 is a schematic circuit diagram of a portion of an integrating analog-to-digital converter constructed in accordance with the teachings of the present invention.
Figure 4:
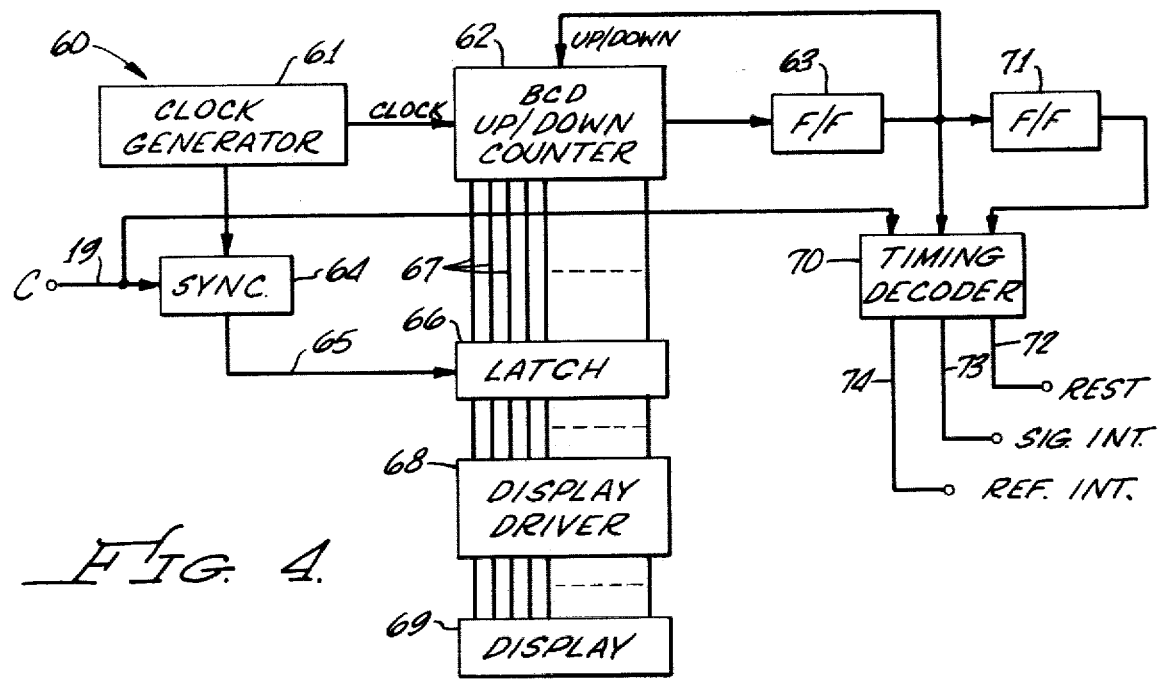
FIG. 4 is a block diagram of the digital timing and output circuitry of the present converter.

Referring now to the drawings and, more particularly, to FIG. 1 thereof, there is shown a simplified diagram of a portion of an integrating analog-to-digital converter, generally designated 10, constructed in accordance with the teachings of the present invention. The digital timing and output circuitry, generally designated 60, of converter 10 is shown in FIG. 4. Converter 10 uses a single capacitor 11 as the energy storing means, capacitor 11 being connectable by a plurality of switches 12–15 between a source of supply potential V+ and a voltage-controlled current source 20. While switches 12–15 are shown as mechanical switches for ease of explanation, it will be obvious to those skilled in the art that transistor switches will, in practice, be used.

One side of capacitor 11 is connected via switch 12 to V+ and the other side thereof is connected via switch 13 to V+, switches 12 and 13 being interconnected for simultaneous operation. The one side of capacitor 11 is connected via switch 14 to a junction 21 at the output of current source 20 whereas the other side of capacitor 11 is connected via switch 15 to junction 21, switches 14 and 15 being interconnected for simultaneous operation. Circuit 10 also includes an amplifier 18 having an inverting input connected to the junction between switches 13 and 15 and capacitor 11 and a non-inverting input connected to V+. The output of amplifier 18 on line 19 produces a timing signal, to be described more fully hereinafter.

Voltage-controlled current source 20 includes an operational amplifier 22 having a non-inverting input connected to first ends of first and second parallel switches 16 and 17 which are operatively interconnected for simultaneous operation. Switch 16 is capable of connecting the input signal on line 23 to operational amplifier 22 whereas switch 17 connects the input of operational amplifier 22 to ground 24. The output of amplifier 22 is connected to the gate input of an NMOS transistor amplifier 25, the drain of which is connected to junction 21 and the source of which is connected to the inverting input of operational amplifier 22. The inverting input of operational amplifier 22 is also connected via a resistor 26 to a source of reference potential $V-$.

Figure 2:
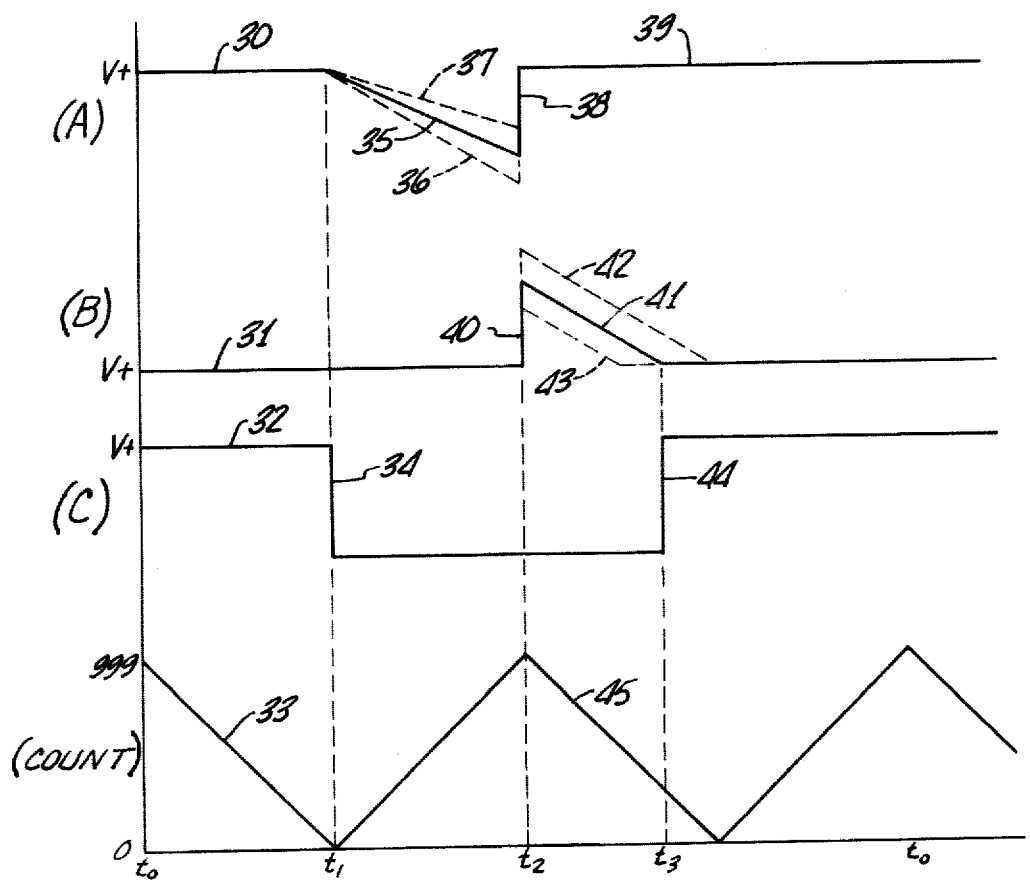
FIGS. 2 and 3 are each a series of waveforms useful in explaining the operation of the circuit of FIG. 1.
Figure 3:
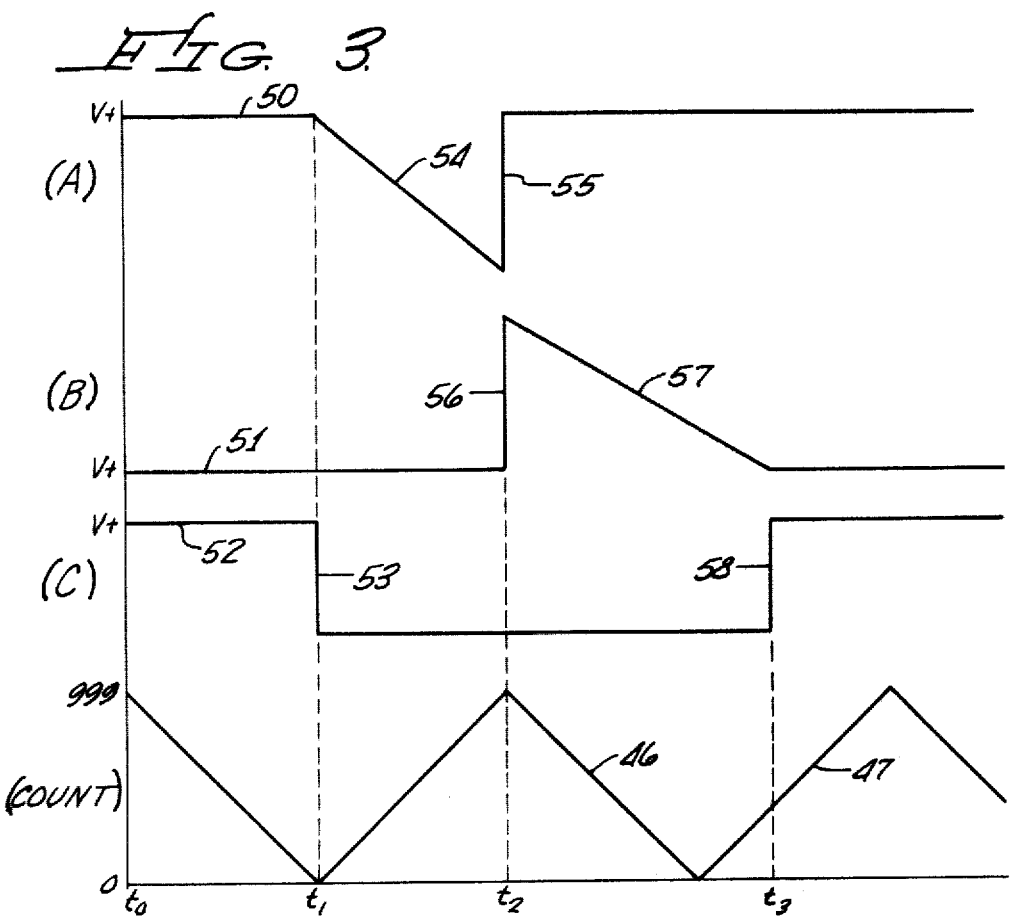

The operation of the circuitry of FIG. 1 will be described with reference to the waveforms of FIGS. 2 and 3 which depict the operation thereof for negative input signals and positive input signals, respectively. In FIGS. 2 and 3, there is shown the waveform at the junction between switches 12 and 14 and capacitor 11, designated A, the waveform at the junction between switches 13 and 15 and capacitor 11, designated B, the waveform on line 19 at the output of amplifier 18, designated C, and the output of a counting means 62, shown in FIG. 4 and to be described more fully hereinafter. For present purposes, suffice it to say that counter 62 continuously and alternately generates an up count and a down count between predetermined low and high counts, here 0 and 999.

At a time $t_0$, marking the start of a complete conversion cycle, counter 62 has just reached the count 999, switches 12 and 14 are closed, switches 13 and 15 are open, switch 16 is open and switch 17 is closed, all as shown. With the switches in this position, point A is connected directly to $V+$, as shown at 30, and point B is negative with respect to $V+$ by an amount equal to the input offset of amplifier 18. For simplicity in explaining the operation of circuit 10, it will be assumed that amplifier 18 has a small negative offset so that point B is near but slightly less than $V+$, as shown at 31. This assumption does not affect the operation of circuit 10. The output of operational amplifier 18 is also at $V+$, as shown at 32. These conditions are characterized as the start of the rest period of circuit 10.

During the rest period, starting at $t_0$, counter 62 counts down from 999 towards 0, as shown at 33. Also during this time, the current I flowing through voltage-controlled current source 20 is drawn directly from $V+$ and there is no charging or discharging of capacitor 11.

When counter 62 reaches a predetermined low count, here a 0 count, at a time $t_1$, marking the start of the input signal integrate period of circuit 10, digital timing circuitry 60 reverses the positions of switches 12, 13, 16, and 17, switches 14 and 15 remaining in the positions shown in FIG. 1. This being the case, the current I now becomes a function of the input signal on line 23. Since point B is now connected to $V+$, the output of amplifier 18 goes low, as shown at 34. Capacitor 11 is now connected between voltage-controlled current source 20 and $V+$ via switches 13 and 14. While there is no instantaneous change in the voltage across capacitor 11, the charge thereacross now begins to change due to the current flow. Because the current supplied to capacitor 11 comes from a high impedance source (voltage-controlled current source 20), the voltage at point A ramps linearly in a negative direction, as shown at 35. The charging rate will be directly proportional to the input signal on line 23. If the input signal were zero, the voltage across capacitor 11 would ramp along dotted curve 36. However, since, in this case, the input signal is presumed to be negative with respect to the common potential, the charging current is reduced and the voltage ramps linearly at a slower rate. If the input signal were even more negative, the voltage at point A would ramp at an even slower rate, as shown by dotted curve 37.

In any event, the modification of the charge on capacitor 11 continues from an initial charge, here zero, and in a first direction at a rate determined by the input signal on line 23 for a first fixed time period determined by the previously referred to free running counter 62. That is, the unknown signal integrate period was initiated when counter 62 reached its predetermined low count, a count of 0, at time $t_1$, and continues until counter 62 reaches its predetermined high count, here a count of 999, at a time $t_2$.

At time $t_2$, marking the end of the fixed time input signal integrate period and the beginning of the variable time reference signal integrate period, digital timing circuit 60 causes all switches to reverse positions. That is, switches 12, 15, and 17 close and switches 13, 14, and 16 open. It should again be remembered that at the end of this time period, at $t_2$, the charge on capacitor 11 will be a function of the charging current and this is a function of the amplitude of the input signal on line 23.

In any event, the reversal of switches 12–15 effectively reverses capacitor 11 between $V+$ and junction 21 so that modification of the charge thereon now proceeds in an opposite direction. That is, point A is immediately connected to $V+$ so that there is a jump in the voltage at point A, as shown at 38. Point A now stays at $V+$, as shown at 39. Since the voltage across a capacitor cannot change instantaneously, there is a corresponding change in the voltage at point B, as shown at 40. Thus, point B will jump in voltage above $V+$ by an amount equal to the existing charge on capacitor 11.

At this time, the voltage at point B will begin to ramp in a negative direction, as shown at 41. Since switch 16 is now open and switch 17 is now closed, the charging current will be fixed and capacitor 11 has its charge modified at a constant rate. On the other hand, the starting point will depend upon the charge previously accumulated across capacitor 11. Therefore, had the charge previously proceeded along curves 36 or 37, charging would now proceed along curves 42 or 43, respectively.

Amplifier 18 is operative to sense the voltage difference between point B and $V+$. Thus, when the charge on capacitor 11 returns to the initial charge, at a time $t_3$, this voltage difference is also returned to the offset voltage of amplifier 18, here near zero. As a result, the output of amplifier 18 goes high, as shown at 44. This terminates the reference signal integrate period. That is, digital timing circuitry 60 senses the change in the output of amplifier 18 and opens switch 15 and closes switch 14. It should be noted that switches 12–17 are now back in the positions which existed at time $t_0$.

Circuit 10 inherently precludes any errors potentially caused by the offset of amplifier 18 and the initial charge on capacitor 11, by ensuring that the initial charge on capacitor 11 at time $t_1$ equals the charge sensed by amplifier 18 at time $t_3$ (the latter being determined by the offset of amplifier 18). This results from the fact that, as discussed in the preceding paragraph, switch 15 opens at time $t_3$, thereby preventing the charge on capacitor 11 from changing until the next conversion operation begins at time $t_1$.

The circuit similarly precludes any errors potentially caused by amplifier 18's having a relatively slow response time or long propagation time. From the time it crosses the threshold sensed by amplifier 18 to the time that amplifier 18 responds by opening switch 15, the capacitor voltage changes by a predetermined amount because the capacitor voltage changes at a predetermined constant rate during the period from $t_2$ to $t_3$. This change in capacitor voltage is like an additional offset voltage of amplifier 18, and is inherently compensated for as discussed in the preceding paragraph.

Consider further the circuitry in FIG. 1 below junction 21. During the fixed-duration input signal integrate period from $t_1$ to $t_2$, switch 16 is closed and switch 17 is open. At $t_2$, switch 16 opens and switch 17 closes. Switch 17 connects the non-inverting input of operational amplifier 22 to common potential point 24. The current flow during the reference signal integrate period from $t_2$ to $t_3$ has a fixed reference value determined by the voltage $V-$, resistor 26, and the offset voltage of operational amplifier 22. While the offset of amplifier 22 does not affect the inherent zeroing characteristic of circuit 10, it should be considered in selecting $V-$, the absolute magnitude of which determines the full scale calibration.

During the time from $t_1$ to $t_2$, when switch 17 is open and switch 16 is closed, the current is determined by the reference voltage source $V-$ and also whatever voltage is applied to the non-inverting input of amplifier 22. In either event, the circuitry below junction 21 operates as a voltage-controlled current source, in one case the current I being controlled by the input voltage and in the other case the current I being fixed.

If the input voltage is zero, the fixed current and the input-voltage-controlled current will be equal. Therefore, it will take the same amount of time to modify the charge on capacitor 11 during the input signal integrate period and the reference signal integrate period and time $t_3$ will correspond to a zero count of counter 62. This corresponds to curves 36 and 42 in FIG. 2 and it will be seen that the voltage at point B returns to $V+$ at a count of 0. As the input voltage on line 23 increases in magnitude of a negative polarity, the charging current during the input signal integrate period decreases so that during the subsequent reference signal integrate period, from $t_2$ to $t_3$, it takes less time for the charge on capacitor 11 to return to the initial charge. During the initial portion of the reference signal integrate period, counter 62 is counting backwards, as shown at 45, so that $t_3$ occurs before it reaches a 0 count. It can be seen that the greater the magnitude of input voltage, with a negative polarity, the less change will occur in the charge on capacitor 11 during the input signal integrate period and the less time it will take to return to the initial charge. The extreme condition will be met when the charging current during the input signal integrate period is zero so that the output count at $t_3$ is $-999$. In any event, for negative input signals, the output of counter 62 will have a negative value that will be directly proportional to the magnitude of the input signal.

On the other hand, as the input voltage increases in magnitude of a positive polarity, the current I during the unknown signal integrate period, from $t_1$ to $t_2$, will be increased rather than decreased. This condition is shown in FIG. 3 where the initial voltages at points A, B, and C, shown at 50, 51, and 52, respectively, are the same as described previously with regard to FIG. 2. At $t_1$, the output of amplifier 18 reverses, as shown at 53, and the voltage at point A begins to ramp linearly, as shown at 54. At $t_2$, as determined by the count in counter 62, when switches 12-17 reverse, point A is immediately connected to $V+$ so that there is a jump in the voltage at point A, as shown at 55. There is a corresponding jump in voltage at point B, as shown at 56. The voltage at point B will now ramp in a negative direction, as shown at 57, until amplifier 18 senses that the charge on capacitor 11 has returned to the initial charge, causing the output thereof to change state, as shown at 58.

During this time, from $t_2$ to $t_3$, counter 62 will count down to 0, as shown at 46, and then start counting up towards 999, as shown at 47. The larger the input voltage on line 23, the greater the time interval between $t_2$ and $t_3$ so that the count will increase with increasing magnitude signals. Accordingly, for positive input signals, the output of counter 62 will have a positive value that will be directly proportional to the magnitude of the input signal.

The net effect is that there is no longer a requirement that the input voltage have an opposite polarity from the reference voltage or a fixed polarity as is the case in most prior art systems. The present circuit converts the input voltage to a charge modifying current and a single circuit produces both positive and negative output counts.

Referring now to FIG. 4, there is shown circuitry 60 for operating switches 12-17 and for providing a digital output representing the amplitude of the analog input signal on line 23. More specifically, digital timing and output circuitry 60 includes a clock oscillator 61 for generating regularly recurring timing pulses and a binary-coded-decimal up/down counter 62 responsive to the clock pulses from oscillator 61 for continuously counting same. Counter 62 counts between predetermined low and high counts, here 0 and 999. A signal indicating that the low or high count has been reached is applied by counter 62 to a flip-flop 63, the output of which is connected back to the reversing input of counter 62. Therefore, each time counter 62 reaches either its low or high count, the output of flip-flop 63 changes state to signal counter 62 to now begin counting in the opposite direction.

The output of oscillator 61 is also connected to a synchronizing circuit 64 which receives the output from operational amplifier 18 on line 19, heretofore designated point C. Circuit 64 synchronizes the change in state of the output of operational amplifier 18 with the timing pulses of clock oscillator 61 and produces a synchronized output on a line 65 whenever the output of operational amplifier 18 goes high. Recalling that this occurs at time $t_3$ and, in fact, defines time $t_3$, the output of sync circuit 64 on line 65 is applied to a latch circuit 66 which receives the count output of counter 62 on lines 67. The output of latch circuit 66 is applied to a display driver 68, the output of which is connected to a display 69. Thus, when the signal on line 65 causes latch 66 to read-out the count in counter 62, this count is applied via driver 68 to display 69 to display such count.

Digital timing and output circuitry 60 also includes a timing decoder circuit 70 which receives the output of operational amplifier on line 19, the output of flip-flop 63, and the output of a flip-flop 71, the input of which is connected to the output of flip-flop 63. Timing decoder 70 is a conventional digital logic circuit for producing three timing pulses on lines 72, 73, and 74 defining the rest period of circuit 10, the input signal integrate period of circuit 10, and the reference signal integrate period of circuit 10, respectively.

The operation of circuitry 60 of FIG. 4 will be described with reference to the waveforms of FIG. 5 which shows the outputs of flip-flops 63 and 71, the three outputs of timing decoder 70, and the output of counter 62. As indicated previously, a function of digital timing and output circuitry 60 is to provide sequential timing commands for the opening and closing of switches 12-17. This is accomplished by dividing the clock pulse output of oscillator 61 with up/down counter 62 so as to establish a fixed counting period. In other words, it will take counter 62 a given fixed time to count either from 0 to 999 or from 999 to 0. Flip-flops 63 and 71 and timing decoder 70 generate the remaining timing commands for the conversion cycle. Termination of the reference signal integrate period, at $t_3$, is the only timing command not directly initiated by the output of flip-flop 63. In addition to establishing switch actuation sequences, digital timing and output circuitry 60 also converts the data from circuit 10 into display information proportional to the absolute value and polarity of the input signal.

Figure 5:
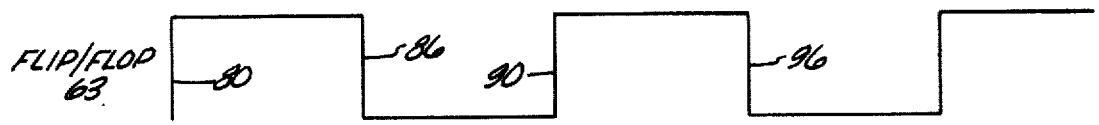
FIG. 5 is a series of waveforms useful in explaining the operation of FIG. 4.
Figure 5:
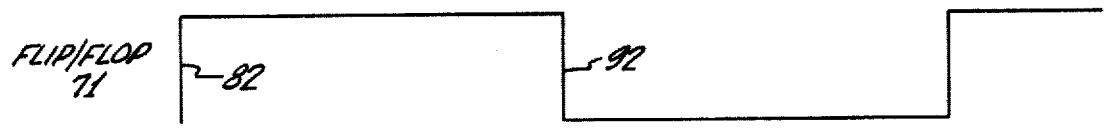
Figure 5:
Figure 5:
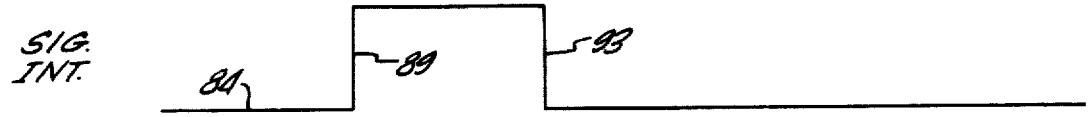
Figure 5:
Figure 5:
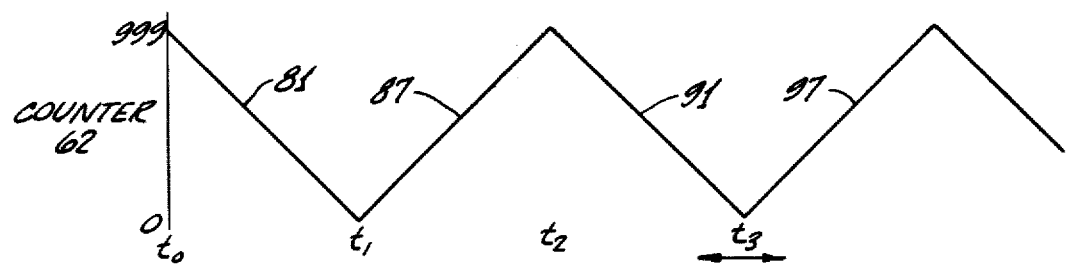

With reference to FIGS. 4 and 5, assume that at $t_0$ counter 62 has just completed counting clock pulses from oscillator 61 in an up count direction and reached count 999. This count causes flip-flop 63 to go high, as shown at 80, thereby signalling counter 62 to reverse its counting direction, as shown at 81. The output of flip-flop 63 is also applied to timing decoder 70 and to flip-flop 71 which also goes high, as shown at 82. This output of flip-flop 71 is also applied to timing decoder 70 which interprets the two high inputs as indicating the start of the rest period. Accordingly, the output of timing decoder 70 on line 72 goes high, as shown at 83. At this time, there are no changes in the signals on output lines 73 and 74, as shown at 84 and 85.

When counter 62 reaches a 0 count, marking the start of the input signal integrate period, the output of flip-flop 63 goes low, as shown at 86, which signals counter 62 to reverse its counting direction, counter 62 now starting to count up, as shown at 87. Flip-flop 71 does not change state at this time, responding only to positive-going transitions at its input. Timing decoder 70 interprets the low output from flip-flop 63 and the high output from flip-flop 71 as the end of the rest period and the start of the input signal integrate period causing its output on line 72 to go low, as shown at 88, and its output on line 73 to go high, as shown at 89. The signal on line 73 is applied to switches 12, 13, 16 and 17 to cause them to reverse positions, as described previously.

When counter 62 again reaches a count of 999, the output of flip-flop 63 again goes high, as shown at 90, which signals counter 62 to reverse its counting direction, whereupon counter 62 begins counting down, as shown at 91. The positive-going transition at the output of flip-flop 63 causes flip-flop 71 to change state, the output of which goes low, as shown at 92. Timing decoder 70 interprets the high output from flip-flop 63 and the low output from flip-flop 71 as signalling the end of the input signal integrate period and the start of the reference signal integrate period. Thus, the input signal integrate output on line 73 goes low, as shown at 93, and the reference signal integrate output on line 74 goes high, as shown at 94. The input signal integrate signal on line 73 is used to reverse switches 12, 13, 16 and 17, while the reference integrate signal is used to reverse switches 14 and 15.

At this time, the low output of flip-flop 71 indicates to timing decoder 70 that the reference signal integrate period is proceeding. One of two events will occur next. Either the output of operational amplifier 18 will go high, in the event of a negative polarity input signal, or counter 62 will reach a 0 count, in the event of a positive polarity input signal. If the former situation occurs first, timing decoder 70, in response to the positive-going timing signal on line 19, signals the end of the reference signal integrate period by going low, as shown at 95, and this signal is used to reverse the positions of switches 14 and 15. The same signal on line 19 causes latch 66 to read out the output of counter 62 for display by display 69.

If, instead, counter 62 first reaches a count of 0, the output of flip-flop 63 goes low, as shown at 96, which signals counter 62 to reverse its counting direction, counter 62 commencing counting up, as shown at 97. Since the output of flip-flop 71 remains low and no signal is received from amplifier 18, timing decoder 70 makes no change in any of its output signals. Rather, decoder 70 waits until the signal on line 19 from amplifier 18 goes high before it terminates the reference signal integrate period, which would now occur as shown at 98. At this time, the output count of counter 62 would be applied by latch 66 to display 69 which would display a positive count.

It can therefore be seen that according to the present invention, the problems encountered heretofore in bipolar integrating analog-to-digital converters are solved in a manner which results in inherent zeroing of offset errors. This is achieved by using the exact same circuits and circuit elements in both the charging and discharging cycles of capacitor 11. In this manner, whatever offsets or drifts which occur and which affect one cycle, affect the other in an equal and opposite manner. The result is that these offsets and drifts are inherently compensated for, the only requirement being that the circuit elements be stable during a complete conversion cycle.

The present system has no components which affect the location of the zero point and no additional compensation circuitry is required.

The present circuit also precludes any errors potentially caused by the initial charge on capacitor 11, by inherently causing the capacitor charge sensed by amplifier 18 at the end of the reference signal integrate period to equal the initial charge at the start of the input signal integrate period. This also causes the offset, speed of operation, and gain of amplifier 18 to have almost no effect on the operation of circuit 10 and to be of no operational concern.

While the invention has been described with respect to the preferred physical embodiment constructed in accordance therewith, it will be apparent to those skilled in the art that various modifications and improvements may be made without departing from the scope and spirit of the invention. For example, the inputs of amplifier 18 may be connected directly across capacitor 11 without affecting the operation of circuit 10. Furthermore, other implementations of voltage-controlled current source 20 will be apparent to those skilled in the art. Accordingly, it is to be understood that the invention is not to be limited by the specific illustrative embodiment, but only by the scope of the appended claims.

I claim:

1. Apparatus for converting an input signal which is bipolar with respect to a common potential and has an amplitude representing an analog quantity into a digital signal representing the quantity comprising:
   a capacitor having first and second terminals;
   a controlled current source, having an input terminal adapted for receipt of said input signal and having an output terminal, for producing through said output terminal a unipolar current having a value determined by the value of said input signal during a first fixed-duration time period and having a fixed value during a second variable-duration time period;
   first switch means for alternately connecting said current source input terminal to said input signal during a first fixed time period and to said common potential during a second variable time period;
   a source of supply potential;
   second switch means for connecting said source of supply potential and said current source output terminal to said first and second capacitor terminals, respectively, during said first time period and for connecting said source of supply potential and said current source output terminal to said second and first capacitor terminals, respectively, during said second time period, said controlled current source modifying from an initial charge and in a first direction the charge on said capacitor at a rate determined by said input signal during said first time period and modifying the charge on said capacitor in the opposite direction and at a fixed rate during said second time period;
   means responsive to said capacitor for generating a timing signal when the charge thereon returns to said initial charge;
   means for generating regularly recurring timing pulses,
   counting means responsive to said timing pulses for continuously and alternately generating an up count and a down count between predetermined low and high counts;
   timing circuit means responsive to said counting means and said timing signal generating means for operating said first and second switch means, said low and high counts establishing the starts of said first and second time periods, respectively, said timing signal establishing the end of said second time period; and
   means responsive to said timing signal generating means for determining the count in said counting means upon the occurrence of said timing signal, said count being representative of said input signal.

2. Apparatus according to claim 1, wherein said first switch means comprises:
   a first switch connected between said current source input terminal and said input signal; and
   a second switch connected between said current source input terminal and said common potential, said first and second switches being alternately opened and closed by said timing circuit means.

3. Apparatus according to claim 2, wherein said timing circuit means closes said first switch on alternate low counts from said counting means and closes said second switch upon the occurrence of a high count from said counting means following one of said alternate low counts therefrom.

4. Apparatus according to claim 1, wherein said second switch means comprises:
   a first switch connected between one side of said capacitor and said source of supply potential;
   a second switch connected between the other side of said capacitor and said source of supply potential;
   a third switch connected between said one side of said capacitor and said current source output; and
   a fourth switch connected between said other side of said capacitor and said current source output.

5. Apparatus according to claim 4, wherein said first and second switches are alternately opened and closed and wherein said third and fourth switches are alternately opened and closed.

6. Apparatus according to claim 5, wherein said timing circuit means opens said first switch and closes said second switch on alternate low counts from said counting means and closes said first switch and opens said second switch upon the occurrence of a high count from said counting means following one of said alternate low counts therefrom.

7. Apparatus according to claim 6, wherein said timing circuit comprises means for opening said third switch and closing said fourth switch upon the occurrence of a high count from said counting means following one of said alternate low counts therefrom and for closing said third switch and opening said fourth switch upon the occurrence of said timing signal.

8. Apparatus according to claim 4, 5, 6, or 7, wherein said timing signal generating means comprises:
   an amplifier having a first input operatively connected to said source of supply potential, a second input operatively connected to said other side of said capacitor, and an output which provides the timing signal, one of the first and second inputs being inverting and the other being noninverting.

9. Apparatus according to claim 1, further comprising:
   a digital display, said count determining means transfering to said digital display said count in said counting means upon the occurrence of said timing signal.

10. Apparatus according to claim 9, wherein said count determining means comprises:
    a latch circuit having an output and responsive to the count output of said counting means for transferring the count in said counting means to said output upon the occurrence of said timing signal.

11. Apparatus according to claim 10, further comprising:
    drive circuit means interposed between said latch circuit output and the input of said digital display for providing driving signals for said display as a function of said latch circuit output count.

12. Apparatus according to claim 1, wherein said count determining means comprises:
    a latch circuit having an output and responsive to the count output of said counting means for transferring the count in said counting means to said output upon the occurrence of said timing signal.

13. Apparatus according to claim 12, further comprising:
    drive circuit means coupled to said latch circuit output for providing driving signals as a function of said latch circuit output count.

14. An integrating analog-to-digital converter circuit for successively performing conversion operations such that each conversion operation produces a digital output signal which represents the value of an analog input signal, the time occupied by a conversion operation being termed a conversion cycle, comprising:

a capacitor, having two terminals, across which appears a capacitor voltage;

a comparator circuit for indicating when the capacitor voltage crosses a threshold;

a timing circuit for dividing each conversion cycle into at least two time periods, including a first time period which begins after the conversion cycle begins and which has a fixed duration, and a second time period which begins after the first time period ends and which ends when the comparator indicates the capacitor voltage has crossed the threshold;

a controlled current source for supplying through a first output terminal a unipolar current having a fixed value during one of said first and second time periods and having a value determined by the input signal during the other of said first and second time periods;

a capacitor switching circuit for connecting the current source output terminal to the first capacitor terminal during said first time period and to the second capacitor terminal during said second time period, whereby the current supplied by the controlled current source modifies the capacitor voltage in one direction at a fixed rate during one of said two time periods, and whereby the current modifies the capacitor voltage in the opposite direction at a rate determined by the input signal during the other of said two time periods; and an output circuit for producing the digital output signal as a function of the relative durations of the first and second time periods.

15. An analog-to-digital converter circuit according to claim 14, further comprising means for preventing the capacitor voltage from changing significantly during the time interval from the end of the second time period of each conversion cycle to the beginning of the first time period the next conversion cycle.

16. An analog-to-digital converter circuit according to claim 14, wherein the capacitor switching circuit prevents the capacitor voltage from changing significantly during the time interval from the end of the second time period of each conversion cycle to the beginning of the first time period of the next conversion cycle by effectively disconnecting at least one terminal of the capacitor from the controlled current source during this time interval.

17. An analog-to-digital converter circuit according to claim 14 wherein the controlled current source further comprises a second output terminal for providing a return path for the current supplied through the first output terminal; and wherein the capacitor switching circuit comprises a first switch connected between one terminal of the capacitor and the first output terminal of the controlled current source;

a second switch connected between said one terminal of the capacitor and the second output terminal of the controlled current source;

a third switch connected between the other terminal of the capacitor and the first output terminal of the controlled current source; and a fourth switch connected between said other terminal of the capacitor and the second output terminal of the controlled current source.

18. An analog-to-digital converter circuit according to claim 14, 15 or 16, wherein the value of the current supplied by the controlled current source equals a fixed value during one of the two time periods and equals the sum of the fixed value and a value dependent on the input signal during the other time period, said input signal dependent value being equal to zero when the value of the input signal equals zero.

19. An analog-to-digital converter circuit according to claim 17, wherein the capacitor switching circuit further comprises circuit means for controlling the four switches to cause each of the first and fourth switches to be conductive during the first period of each conversion cycle and to be non-conductive during the second period of each conversion cycle, and to cause each of the second and third switches to be non-conductive during the first period of each conversion cycle and to be conductive during the second period of each conversion cycle.

20. An analog-to-digital converter according to claim 19, wherein the circuit means for controlling the four switches effectively disconnects at least one terminal of the capacitor from the controlled current source during the time interval from the end of the second period of each conversion cycle to the beginning of the first period of the next conversion cycle either by causing each of the first and second switches to be non-conductive during this time interval, or by causing each of the third and fourth switches to be non-conductive during this time interval.

21. An analog-to-digital converter circuit according to claim 17, 19 or 21, wherein each of the four switches comprises a transistor.

22. An analog-to-digital converter circuit according to claim 14, 15, 16, 17, 19 or 20, wherein the controlled current source further comprises:

a first analog-input terminal and a second analog-input terminal, adapted for receipt of the analog input voltage so that said voltage appears across the first and second analog-input terminals;

an operational amplifier including an amplifier output, a first amplifier input and a second amplifier input, one of the amplifier inputs being inverting and the other being non-inverting;

an input switching circuit, connected to the first amplifier input and the two analog-input terminals, which selectively connects the first amplifier input to either the first analog-input terminal or the second analog-input terminal;

a first reference voltage terminal and a second reference voltage terminal, adapted for connection to a first voltage source, the second reference voltage terminal being connected to the second analog-input terminal;

a resistor, connected between the first reference voltage terminal and the second amplifier input; and a transistor comprising a first transistor terminal, a second transistor terminal and a control terminal such that a voltage across the control terminal and the second transistor terminal affects the amount of a current flowing through the first transistor terminal, wherein one of the first and second transistor terminals connects to the first output terminal of the controlled current source, the other one of the two transistor terminals connects to the second amplifier input, and the control terminal connects to the amplifier output.

23. A converter circuit according to claim 22, wherein the first transistor terminal, the second transistor terminal and the control terminal are the drain, the source, and the gate of the transistor, respectively.

24. A converter circuit according to claim 22, wherein the first transistor terminal, the second transistor terminal and the control terminal are the collector, the emitter and the base of the transistor, respectively.

25. A converter circuit according to claim 24, wherein the input switching circuit connects the first amplifier input to one of the two analog-input terminals during the first time period of each conversion cycle, and connects the first amplifier input to the other one of the two analog-input terminals during the second time period of each conversion cycle.

26. A converter circuit according to claim 23, wherein the input switching circuit connects the first amplifier input to one of the two analog-input terminals during the first time period of each conversion cycle, and connects the first amplifier input to the other one of the two analog-input terminals during the second time period of each conversion cycle.

27. A converter circuit according to claim 26 wherein the controlled current source further comprises a second output terminal for providing a return path for the current supplied through the first output terminal; and wherein the controlled current source is further adapted for connecting a second voltage source between the second output terminal of the controlled current source and one of the two reference voltage terminals.

28. A converter circuit according to claim 26, wherein each of the four switches within the capacitor switching circuit comprises a transistor.

29. A converter circuit according to claim 27, wherein each of the four switches within the capacitor switching circuit comprises a transistor.

30. A converter circuit according to claim 25 wherein the controlled current source further comprises a second output terminal for providing a return path for the current supplied through the first output terminal; and wherein the controlled current source is further adapted for connecting a second voltage source between the second output terminal of the controlled current source and one of the two reference voltage terminals.

31. A converter circuit according to claim 29, wherein each of the four switches within the capacitor switching circuit comprises a transistor.

32. A converter circuit according to claim 30, wherein each of the four switches within the capacitor switching circuit comprises a transistor.

* * * * *